United States Patent [19]

Reinhold

[11] 4,141,002
[45] Feb. 20, 1979

[54] MODULAR COLUMNAR ELECTROLUMINESCENT DISPLAY CONTROL CIRCUIT

[75] Inventor: William F. Reinhold, Charlottesville, Va.

[73] Assignee: Sperry Rand Corporation, New York, N.Y.

[21] Appl. No.: 776,577

[22] Filed: Mar. 11, 1977

[51] Int. Cl.² .............................................. G06F 3/14
[52] U.S. Cl. ............................. 340/760; 340/166 EL
[58] Field of Search ....... 340/324 R, 324 M, 166 EL, 340/154, 336

[56] References Cited

U.S. PATENT DOCUMENTS

| | | | |
|---|---|---|---|
| 3,651,511 | 3/1972 | Andrews et al. | 340/154 |
| 3,987,392 | 10/1976 | Kugelmann et al. | 340/324 R |
| 4,060,802 | 11/1977 | Matsuki | 340/336 |

Primary Examiner—Marshall M. Curtis
Attorney, Agent, or Firm—Howard P. Terry

[57] ABSTRACT

The electroluminescent display provides a columnar, bar, or the like incremental analog presentation of an unknown unidirectional electric signal amplitude. Employing a stacked array of luminescent diodes, each diode of the diode array is associated with a circuit element controlled by a voltage comparator and an illumination intensity modulation source. The control circuits and diodes are adapted to use in simple cascaded modular circuit form permitting a wide range of choices of the number of diodes in the bar display and therefore, of its useful voltage indicating range. Variable pulse duty cycle brightness control is afforded.

1 Claim, 1 Drawing Figure

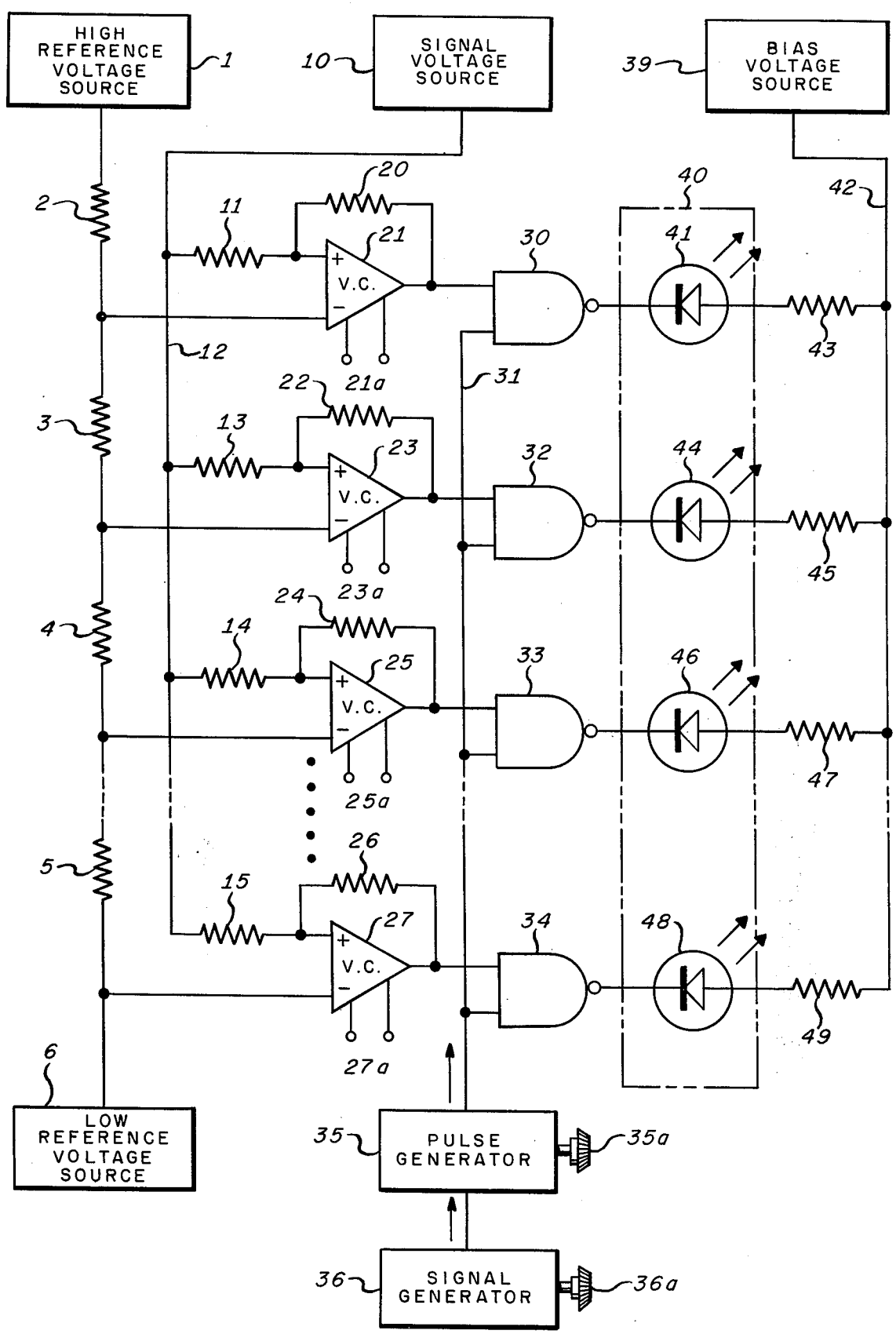

MODULAR COLUMNAR ELECTROLUMINESCENT DISPLAY CONTROL CIRCUIT

BACKGROUND OF THE INVENTION

1. Field of the Invention

The invention relates generally to data display systems and more particularly to data display systems of the kind commonly known as bar graph displays in which an indicator line of the display represents the numerical value of an analog input signal amplitude.

2. Description of the Prior Art

Generally, prior art analog bar graph display devices have, on the one hand, employed cathode ray indicator techniques such as those of the kind described in the Bialkowski et al U.S. Pat. No. 3,248,650 for a "Cathode Ray Tube Indicator for Displaying Plural Input Signal Values", issued Apr. 26, 1966. While such arrangements find utility where a plurality of bar graphs is to be displayed side-by-side for mutual comparison purposes, cathode ray tubes, by their inherent nature, occupy considerable volume, extending well behind the face of the display and also undesirably require high voltages for electron beam acceleration and deflection purposes.

On the other hand, there are prior art electroluminescent bar graph displays utilizing arrays of electrically stimulatable light emitting diode elements which have met with some success. While such individual bar graph display devices may be placed in side-by-side relation, the resultant assembly still does not satisfy entirely needs for more compact and efficient displays. Even when used singly, more compact devices are in significant demand. Many prior art electroluminescent bar graph devices also are characterized by a built-in lack of flexibility of use, the entire display element being offered in integrated form so that the display designer's effort is severely confined by limitations thereby imposed. For example, recent displays, such as those of the Joline U.S. Pat. No. 3,221,169 for an "Electroluminescent Graphical Display Device", issued Nov. 30, 1965, and of the Yiotis U.S. Pat. No. 3,275,871 for "Display Apparatus", issued Sept. 27, 1966 are representative of such integrated display devices. These two patents are also assigned to Sperry Rand Corporation and additionally illustrate a trend in the art toward the use of complex logical control circuits made necessary by the nature of the displays.

SUMMARY OF THE INVENTION

The present invention relates to an electroluminescent display device providing an incremental columnar bar display of analog data by simple and non-complex means. The display employs a stacked array of luminescent diodes, each diode of the array being associated with its particular control circuit including a voltage comparator and an illumination level control element. Several control circuits and associated diodes are adapted to form individual modules, the modules being useful in forming a simple stacked or cascaded assembly and permitting a wide range of choices of the number of diodes generating the desired bar display. Modularity is achieved while still retaining simplicity of structure and operation.

BRIEF DESCRIPTION OF THE DRAWING

The sole FIGURE provides a circuit wiring diagram of the invention, illustrating components used in the invention and their electrical interconnections.

DESCRIPTION OF THE PREFERRED EMBODIMENTS

In the sole FIGURE, an arrangement is shown for activating the novel bar graph vertical display indicated at 40. It will be understood that the bar graph display assembly may be placed in other attitudes, such as horizontal, and that it may readily take the form of a circular or other sector. The individual luminescent diodes are shown spaced apart only as a matter of convenience in the enclosure at 40, though it will be understood that they will, in practice, normally be packed together in close contiguous relation. While only four electroluminescent diodes are shown in the array of diodes of the drawing, it will be understood that many more diodes may be employed, depending upon convenience in modular packaging and the degree of resolution required of the display. It will further be understood that the invention is useful with a variety of types of diodes such as produce light in various regions of the optical spectrum.

To provide successively different discrete operating reference voltages for the array of luminescent diodes, a high reference voltage source 1 (say, +15 volts) and a low reference source 6 (say, zero volts) are coupled at opposite ends of a voltage divider consisting of equal-valued resistors 2, 3, 4 and 5. Taps such as those between resistors 2 and 3, 3 and 4 and 4 and 5 respectively couple the several reference voltages to the inverting inputs of the respective voltage comparators 21, 23, 25, 27.

Signal source 10 represents a source of variable unidirecttional voltage whose amplitude is to be displayed by the diode array at 40. As seen in the figure, the voltage of unknown magnitude is supplied via lead 12 through the respective branching resistors 11, 13, 14, 15 to the respective non-inverting inputs of voltage comparators 21, 23, 25, 27. The respective comparators 21, 23, 25, 27 are equipped with respective hysteresis resistors 20, 22, 24, 26. Further, they are each supplied with a pair of source bias voltages, as by the respective lead pairs 21a, 23a, 25a, 27a. In one form of the invention, the latter bias voltage levels were +15 volts and ground. In this manner, the several voltage comparators are designed to function as conventional non-inverting comparator circuits with hysteresis. They may be of the commercially available type designated by the National Semiconductor model number LM139A.

The respective comparison outputs of the comparator circuits including voltage comparators 21, 23, 25, 27 are coupled to a respective input of a NAND gate circuit 30, 32, 33, 34. The NAND circuits, properly supplied by a source bias voltage as will be understood by those skilled in the art, are conventional NAND gates of a type, for example, similar to Texas Instrument's model SN5438 and of the kind having open collector output transistors for driving the individual light-emitting diodes. Further, an illumination level control voltage is coupled via lead 31 to a second input of each NAND circuit. Any unknown signal passed by a selected succession of NAND gates passes to corresponding respective ones of electroluminescent diodes 41, 44 46, 48 of array 40. For completing the energization of the selected diodes of the array, the semiconductor diodes are coupled through respective resistors 43, 45, 47, 49 and lead 42 to the bias voltage source 39 (say, +5 volts). The illumination level control signal on lead 31 is a variable pulse width signal developed by a conventional voltage pulse generator 35. The widths or time durations of the pulses provided by generator 35 may be manually selected according to the setting of conventional control 35a. The repetition frequency of the pulse train is determined by the signal generator 36, which excites pulse generator 35, according to the setting of conventional manual control 36a, and is preferably chosen so that flicker is absent in the display. In one form of the display, the latter frequency was 200 Hz.

In operation, a bright columnar or bar graph display is produced by applying a version of the unknown voltage level to be displayed to the non-inverting inputs of the array of voltage comparators 21, 23, 25, 27. The several inverting inputs of each voltage comparator are coupled to successive taps along series resistor voltage divider 2, 3, 4, 5. In this manner, the unknown input signal is quantized against a reference voltage. Each voltage comparator circuit is gated by a corresponding NAND gate 30, 32, 33, 34 with a pulse width modulated signal from generator 35. It is seen that each voltage comparator circuit compares the level of the unknown input signal against a portion of the reference voltage according to a corresponding voltage divider tap. When the sign of the difference between the unknown input signal voltage and the tapped reference voltage is positive and the illumination level control signal is in its high state on lead 31, the associated luminescent semiconductor diode is illuminated. Illumination is turned off in the presence of a low state of the pulse width modulated output of generator 35. Variation of the pulse width enables the operator to change the brightness of the display in accord with the level of ambient light, enabling dimming of the display for dark-adapted eye observation. For use in high ambient or day-light illumination, conventional optical filtering may also be employed to enhance the readability of the display.

In one example, a lineal array of eight subminiature red emitting luminescent diodes was employed of the commercially available HP 5082-4100 red light emitting type. For linear motion of the bottom of the illuminated column of the display, resistors 2 through 5 were each 51 Kohms, resistors 11, 13, 14, 15, were each 10 Kohms, and resistors 20, 22, 24, 26 were each 10 Mohms, while resistors 43, 45, 47, 49 were each 75 ohms. All reference voltages were unidirectional and none was greater than +15 volts; bias source 39 supplied +5 volts to lead 42. It will be understood that the component values mentioned in the example are subject to variation within the scope of the novel invention in dependence upon the number and characteristics of the encapsulated diodes in the array and the like. It will further be understood that a linear scale is provided by the invention as shown in the figure, though other scales may readily be presented. For example, if a conventional logarithmic circuit is inserted between source 10 in lead 12 and the branching circuit of resistor 11, the presentation will be with respect to a logarithmic scale.

Accordingly, it is seen that the invention provides a simple and compact electroluminescent device for providing a columnar bar display of analog data. The display includes a stacked array of luminescent diodes, each light emitting diode being associated with its particular control circuit and modular circuit. For example, one such module would include resistors 3, 13, and 22, amplifier 23, NAND gate 32, diode 44, and resistor 45. Other modules would be similar. Appropriate extensions passing through each such module would be made of certain electrical leads, such as leads 12, 31 and 42, as will be understood by those skilled in the art. such modules readily provide the possibility of generating cascaded assemblies readily fitting the needs of the design engineer while still making use of very simple control circuits employing a minimum number of electrical components.

While the invention has been described in its preferred embodiments, it is to be understood that the words which have been used are words of description rather than of limitation and that changes within the purview of the appended claims may be made without departing from the true scope and spirit of the invention in its broader aspects.

I claim:

1. A bar graph display comprising:
a plural number of electroluminescent semiconductor diode means disposed in a contiguous manner in lineal array,
first reference voltage source means for providing a first voltage,
second reference voltage source means for providing a second voltage,
tapped voltage divider means coupled between said first and said second voltage source means,
said tapped voltage divider means having a number of tap means equal to said plural number, and including series connected first resistors having equal resistances,
a number of voltage comparator means equal to said plural number,
each successive voltage comparator means being coupled to a corresponding successive one of said tap means,
each said successive voltage comparator means being additionally responsive to an input signal of unknown magnitude for forming a first or a second discrete comparison output,
second resistors of second equal resistances for coupling in parallel said input signal of unknown magnitude to each said respective successive voltage comparator means,
bias voltage source means,
each said successive electroluminescent semiconductor diode means being responsive separately to said bias voltage source means and to a corresponding one of said discrete comparison outputs,
third resistors of third equal resistances for coupling in parallel said bias voltage source means to each successive electroluminescent diode means,
a number of NAND gate means equal to said plural number,
each said NAND gate means having first and second input means and one output means,
said first input means being responsive to a corresponding one of said discrete comparison outputs, and
said one output means being coupled to said bias voltage source means,
means for coupling adjustable width pulse generator means to said second input means of said NAND gate means for selectively adjusting the illumination level of said electroluminescent semiconductor diode array with respect to the ambient illumination condition, and
signal generator means coupled to said pulse generator means for excitation of said pulse generator means at a repetition frequency chosen so that flicker is absent from said electroluminescent semiconductor diode array.

* * * * *